(12) United States Patent
Abe

(10) Patent No.: US 10,950,768 B2
(45) Date of Patent: Mar. 16, 2021

(54) CIRCUIT BOARD AND LIGHT-EMITTING DEVICE PROVIDED WITH SAME

(71) Applicant: KYOCERA Corporation, Kyoto (JP)

(72) Inventor: Yuichi Abe, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/608,654

(22) PCT Filed: Apr. 20, 2018

(86) PCT No.: PCT/JP2018/016330
§ 371 (c)(1),
(2) Date: Oct. 25, 2019

(87) PCT Pub. No.: WO2018/198982
PCT Pub. Date: Nov. 1, 2018

(65) Prior Publication Data
US 2020/0194640 A1    Jun. 18, 2020

(30) Foreign Application Priority Data
Apr. 27, 2017  (JP) .............................. JP2017-088504

(51) Int. Cl.
*H01L 33/60*  (2010.01)
*H01L 33/62*  (2010.01)
(52) U.S. Cl.
CPC .............. *H01L 33/60* (2013.01); *H01L 33/62* (2013.01); *H01L 2933/0058* (2013.01); *H01L 2933/0066* (2013.01)

(58) Field of Classification Search
CPC ............. H01L 33/60; H01L 2933/0058; H01L 33/0066; H01L 33/62
USPC ........................................................... 257/98
See application file for complete search history.

(56) References Cited

U.S. PATENT DOCUMENTS

2008/0239216 A1* 10/2008  Miyamoto ........... B42D 25/328
                                                              349/113
2012/0181560 A1   7/2012  Hiramatsu et al.
2016/0284959 A1   9/2016  Ishikawa
2017/0053903 A1*  2/2017  Nishimura .............. H01L 33/56

FOREIGN PATENT DOCUMENTS

| JP | 2009-129801 A | 6/2009 |
| JP | 2012-151191 A | 8/2012 |
| JP | 2015-162623 A | 9/2015 |
| JP | 2016-018068 A | 2/2016 |
| JP | 2016-184708 A | 10/2016 |
| WO | 2007/114306 A1 | 10/2007 |
| WO | 2014/042201 A1 | 3/2014 |

* cited by examiner

*Primary Examiner* — Tong-Ho Kim
(74) *Attorney, Agent, or Firm* — Volpe Koenig

(57) ABSTRACT

A circuit board of the present disclosure includes a substrate, a conductor layer located on the substrate, a reflective layer located on the conductor layer, and a resin layer located on the substrate to be in contact with the conductor layer and the reflective layer. In a surface of the reflective layer, arithmetic mean roughness Ra obtained from a roughness profile is less than 0.2 μm, and a ratio of kurtosis Rku obtained from a roughness profile to skewness Rsk obtained from a roughness profile is 5 or more and 15 or less.

16 Claims, 1 Drawing Sheet

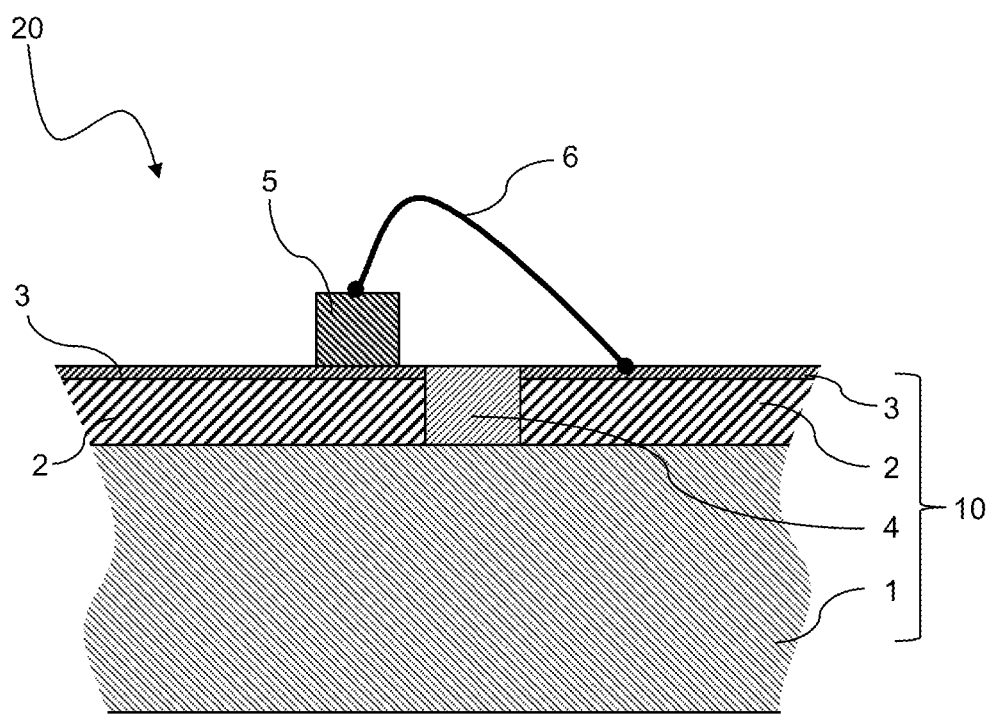

CIRCUIT BOARD AND LIGHT-EMITTING DEVICE PROVIDED WITH SAME

CROSS-REFERENCE TO RELATED APPLICATIONS

This application is national stage application of International Application No. PCT/JP2018/016330, filed on Apr. 20, 2018, which designates the United States, incorporated herein by reference, and which claims the benefit of priority from Japanese Patent Application No. 2017-088504, filed on Apr. 27, 2017, the entire contents of both of which are incorporated herein by reference.

FIELD

The present disclosure relates to a circuit board and a light-emitting device provided with the same.

BACKGROUND

LEDs (light-emitting diodes) are attracting attention as a light-emitting element with low power consumption. A circuit board is used for mounting such a light-emitting element, which includes an insulating substrate and a conductive layer that is located on this substrate and serves as a circuit (wiring).

Improvement of luminous efficiency is required for a light-emitting device with a light-emitting element mounted on the circuit board having the above-described configuration. In order to improve luminous efficiency, a surface of the substrate is covered with a white tone resin (see Patent Literature 1, for example).

CITATION LIST

Patent Literature

Patent Literature 1: Japanese Patent Application Laid-open No. 2009-129801

SUMMARY

A circuit board of the present disclosure includes a substrate, a conductor layer located on the substrate, a reflective layer located on the conductor layer, and a resin layer located on the substrate to be in contact with the conductor layer and the reflective layer. In a surface of the reflective layer, arithmetic mean roughness Ra obtained from a roughness profile is less than 0.2 µm, and a ratio of kurtosis Rku obtained from a roughness profile to skewness Rsk obtained from a roughness profile is 5 or more and 15 or less.

BRIEF DESCRIPTION OF DRAWING

FIG. 1 is a cross-sectional view schematically illustrating an example of peripherals of a light-emitting element in a light-emitting device of the present disclosure.

DESCRIPTION OF EMBODIMENTS

In recent years, not only a surface of a substrate is covered with a white tone resin, but also a reflective layer is provided on a conductive layer to improve luminous efficiency. In order to further improve luminous efficiency, improvement of a reflectance of the reflective layer is now required.

A circuit board of the present disclosure has a high reflectance. The circuit board of the present disclosure is described in detail below, referring to FIG. 1.

As illustrated in FIG. 1, a circuit board 10 of the present disclosure includes a substrate 1, a conductor layer 2 located on the substrate 1, a reflective layer 3 located on the conductor layer 2, and a resin layer 4 located on the substrate 1 to be in contact with the conductor layer 2 and the reflective layer 3.

In a surface of the reflective layer 3 in the circuit board 10 of the present disclosure, arithmetic mean roughness Ra obtained from a roughness profile is less than 0.2 µm, and a ratio (Rku/Rsk) of kurtosis Rku obtained from the roughness profile to skewness Rsk obtained from the roughness profile is 5 or more and 15 or less. The surface of the reflective layer 3 refers to an exposed surface of the reflective layer 3 which reflects light.

The arithmetic mean roughness Ra is a value defined in JIS B 0601(2013). The skewness Rsk is defined in JIS B 0601(2013) and is a measure of a ratio of peaks and valleys when a mean height in a roughness profile is assumed as a center line. The kurtosis Rku is defined in JIS B 0601(2013) and is a measure of kurtosis that is a scale of sharpness of a surface.

Because the arithmetic mean roughness Ra is less than 0.2 µm, the surface of the reflective layer 3 in the circuit board 10 of the present disclosure can suppress diffuse reflection of light. Further, because Rku/Rsk is 5 or more and 15 or less, the surface of the reflective layer 3 has such a surface texture that a portion around an apex of a peak becomes sharp and a ratio of valleys is large. Therefore, light can be totally reflected easily. Accordingly, the circuit board 10 of the present disclosure has a high reflectance. In the surface of the reflective layer 3 in the circuit board 10 of the present disclosure, the skewness Rsk is 1.8 or more and 2.3 or less and the kurtosis Rku is 9.0 or more and 31.9 or less, for example.

The arithmetic mean roughness Ra, the skewness Rsk, and the kurtosis Rku in the surface of the reflective layer 3 can be obtained by performing measurement in conformity to JIS B 0601(2013). It suffices that a measurement condition is set in such a manner that a measurement length is 2.5 mm, a cut-off value is 0.08 mm, a stylus with a stylus radius of 2 µm is used, and a scan rate is 0.6 mm/s, for example. It suffices that the measurement is performed at least three positions in the surface of the reflective layer 3 and an average value is obtained.

Further, in the surface of the reflective layer 3 in the circuit board 10 of the present disclosure, a ratio (Mr2/Mr1) of a material portion Mr2 of a roughness core in a projecting valley obtained from a roughness profile to a material portion Mr1 of a roughness core in a projecting peak obtained from the roughness profile may be larger than 3. The material portion Mr1 of the roughness core in the projecting peak and the material portion Mr2 of the roughness core in the projecting valley are defined in JIS B 0671-2(2002) in the following manner. First of all, a secant line of a material ratio curve, which is drawn in a center portion of the material ratio curve including 40% of measured points of a roughness profile with a difference of material portions set to 40% and which has the gentlest slope, is assumed as an equivalent line. Subsequently, a portion between two height positions of intersections of this equivalent line and the vertical axis at a material portion of 0% and at a material portion of 100% is assumed as a roughness core. A material portion at an intersection of the roughness profile and a separation line that separates a projecting peak above the roughness core from the roughness core is Mr1. Further, a material portion at an intersection of the roughness profile and a separation line that separates a projecting valley below the roughness core from the roughness core is Mr2.

If the surface of the reflective layer 3 meets the above conditions of the configuration, a bottom of the projecting valley in that surface is wide, and therefore a regular reflectance of the reflective layer 3 becomes high, so that the circuit board 10 of the present disclosure is more excellent in a reflectance.

In the surface of the reflective layer 3 in the circuit board 10 of the present disclosure, for example, the material portion Mr1 of the roughness core in the projecting peak is 24 or less and the material portion Mr2 of the roughness core in the projecting valley is 74 or more.

In the surface of the reflective layer 3 in the circuit board 10 of the present disclosure, a reduced valley depth Rvk obtained from the roughness profile may be smaller than a reduced peak height Rpk obtained from the roughness profile. The reduced valley depth Rvk and the reduced peak height Rpk are defined in JIS B 0671-2(2002). In the roughness profile, the average depth of projecting valleys below the above-described roughness core is the reduced valley depth Rvk, and the average height of projecting peaks above the above-described roughness core is the reduced peak height Rpk.

If the surface of the reflective layer 3 meets the above conditions of the configuration, there are few projecting valleys in that surface. Therefore, a regular reflectance of the reflective layer 3 becomes high, so that the circuit board of the present disclosure is further excellent in a reflectance.

In the surface of the reflective layer 3 in the circuit board 10 of the present disclosure, the reduced valley depth Rvk is 0.07 μm or less and the reduced peak height Rpk is 0.10 μm or more, for example.

In the surface of the reflective layer 3 in the circuit board 10 of the present disclosure, a rate of plateau whose relative material length obtained from the roughness profile is 10 to 60%, Hp(10-60%), may be 0.30 μm or less, and a ratio (Hp(10-60%)/Hp(10-20%)) of the rate of plateau Hp(10-60%) to a rate of plateau whose relative material length obtained from the roughness profile is 10 to 20%, Hp(10-20%), may be less than 3.5.

A rate of plateau Hp is defined in JIS B 0671-2(2002) in the following manner. The rate of plateau whose relative material length is 10 to 60%, Hp(10-60%), represents a distance between a depth at which a ratio of contact areas of a surface when the reflective layer 3 is shaved to a certain depth and a virtual plane becomes 10% and a depth at which that ratio of contact areas becomes 60%. The rate of plateau whose relative material length is 10 to 20%, Hp(10-20%), represents a distance between the depth at which the ratio of contact areas of the surface when the reflective layer 3 is shaved to a certain depth and the virtual plane becomes 10% and a depth at which that ratio of contact areas becomes 20%.

If the surface of the reflective layer 3 meets the above conditions of the configuration, there are few peaks and valleys in that surface. Therefore, a regular reflectance component is increased, so that a reflectance of the circuit board 10 of the present disclosure is further improved.

The material portion Mr1 of the roughness core in the projecting peak, the material portion Mr2 in the projecting valley, the reduced valley depth Rvk, the reduced peak height Rpk, the rate of plateaus Hp in the surface of the reflective layer 3 can be obtained by performing measurement under the same measurement condition as that for the arithmetic mean roughness Ra, the skewness Rsk, and the kurtosis Rku described above, in conformity to JIS B 0671-2(2002).

It suffices that the substrate 1 in the circuit board 10 of the present disclosure is an insulator. Examples of the insulator include aluminum oxide ceramic, zirconium oxide ceramic, ceramic composite of aluminum oxide and zirconium oxide, silicon nitride ceramic, aluminum nitride ceramic, silicon carbide ceramic, and mullite ceramic. If the substrate 1 is made of aluminum oxide ceramic, it can be easily processed and has excellent mechanical strength. If the substrate 1 is made of aluminum nitride ceramic, it has an excellent heat dissipating property.

For example, aluminum oxide ceramic contains 70 mass % or more of aluminum oxide in 100 mass % of all components of ceramic. The material of the substrate 1 in the circuit board 10 of the present disclosure can be confirmed by the following method. First of all, measurement is performed for the substrate 1 by using an X-ray diffractometer (XRD), and identification from obtained 2θ (2θ is a diffraction angle) is performed by using a JCPDS card. Subsequently, quantitative analysis of components is performed by using an ICP atomic emission spectrophotometer (ICP) or an X-ray fluorescence spectrometer (XRF). If existence of aluminum oxide is confirmed by the above identification and a value in terms of aluminum oxide ($Al_2O_3$) calculated from the content of aluminum (Al) measured by the XRF is 70 mass % or more, the material of interest is aluminum oxide ceramic. As for other ceramics, the same method can be applied.

The conductor layer 2 in the circuit board 10 of the present disclosure may be made of any material as long as that material is conductive. If the conductor layer 2 mainly contains copper or silver, an electrical resistivity is low, and a thermal conductivity is high. Therefore, it is possible to mount a light-emitting element 5 with a large amount of heat generation on the conductor layer 2. The main component of the conductor layer 2 is a component whose mass % exceeds 50 mass % in 100 mass % of all components of the conductor layer 2.

The reflective layer 3 in the circuit board 10 of the present disclosure contains at least one of gold and silver and may contain 90 mass % or more of gold and silver in total in 100 mass % of all components of the reflective layer 3. In particular, the reflective layer 3 in the circuit board 10 of the present disclosure may contain 95 mass % or more of gold in 100 mass % of all components of the reflective layer 3. If the reflective layer 3 contains 95 mass % or more of gold, migration hardly occurs in the reflective layer 3 when a current is caused to flow in the reflective layer 3. Therefore, the circuit board 10 of the present disclosure has excellent long-term reliability.

It suffices that the resin layer 4 in the circuit board 10 of the present disclosure has a higher reflectance than the substrate 1. Specifically, it is preferable that the resin layer 4 is a resin that presents a white tone. Examples of the resin that presents a white tone include silicone resin, epoxy resin, or the like that contains white inorganic filler such as titanium oxide, aluminum oxide, zirconium oxide, barium oxide, barium sulfate, zinc oxide, barium titanate, or potassium titanate.

It suffices that components of the conductor layer 2, the reflective layer 3, and the resin layer 4 are confirmed by the following method. First of all, the circuit board 10 is cut to obtain a cross-section illustrated in FIG. 1, and the obtained cross-section is polished with a cross-section polisher (CP).

Subsequently, it suffices that the polished cross-section is observed as an observation surface by using a scanning electron microscope (SEM) and the respective components of the conductor layer 2, the reflective layer 3, and the resin layer 4 are confirmed by using an energy dispersive x-ray spectrometer (EDS) attached to the SEM. Alternatively, confirmation can be performed by shaving off a portion of each of the conductor layer 2, the reflective layer 3, and the resin layer 4 and using the ICP or the XRF.

The substrate 1 in the circuit board 10 of the present disclosure may have a through hole. If an electrode made of a conductive material is provided in the through hole of the substrate 1, it is possible to connect the electrode to an external power supply or the like and enable electricity to be supplied. If a thermal via made of a high thermal conductivity material is provided in the through hole of the substrate 1, the heat dissipating property of the substrate 1 can be improved.

A light-emitting device 20 of the present disclosure includes the circuit board 10 having the above-described configuration and the light-emitting element 5 located on the circuit board 10. FIG. 1 illustrates an example in which the light-emitting element 5 is located on a reflective layer 3 and the light-emitting element 5 is electrically connected to a reflective layer 3 by a bonding wire 6. A surface of the light-emitting device 20 on a side where the light-emitting element 5 is mounted, which includes the light-emitting element 5, may be covered with a sealing material or the like to protect the light-emitting element 5, although not illustrated. The sealing material may contain a fluorescent material and the like for wavelength conversion.

An example of a manufacturing method of the circuit board 10 of the present disclosure is described below.

First of all, a substrate of aluminum nitride ceramic or aluminum oxide ceramic, for example, is prepared as the substrate 1 by a known molding method and a known sintering method. When aluminum oxide ceramic is formed, at least one of barium oxide (BaO) and zirconium oxide ($ZrO_2$) may be contained to improve a reflectance of the substrate 1.

In a case of forming a through hole in the substrate 1, it suffices that the through hole is formed together with an outer shape when a molded body is formed, or is formed by punching, blasting, or using laser in a molded body in which only its outer shape has been processed, or is formed in a sintered body by blasting or using laser. The thickness of the substrate 1 is 0.15 mm or more and 1.5 mm or less, for example.

Subsequently, thin layers of titanium and copper are formed on the substrate 1 by sputtering. In a thin film, the average thickness of the titanium layer is 0.03 μm or more and 0.2 μm or less and the average thickness of the copper layer is 0.5 μm or more and 2 μm or less, for example.

Subsequently, a resist pattern is formed on the thin film by photolithography, and a new copper layer is formed by electrolytic copper plating. In this manner, the conductor layer 2 is obtained. The average thickness of the copper layer formed by electrolytic copper plating is 40 μm or more and 100 μm or less, for example. Further, buffing or chemical polishing may be performed for a surface of the conductor layer 2.

Subsequently, the reflective layer 3 of silver is obtained on the conductor layer 2 by performing electrolytic nickel-silver plating and/or electroless silver plating. Alternatively, the reflective layer 3 of gold is obtained on the conductor layer 2 by performing electroless nickel plating and thereafter performing electroless gold plating. Alternatively, the reflective layer 3 of gold is obtained on the conductor layer 2 by performing electroless nickel plating, electroless palladium plating, and electroless gold plating in this order. In a case where a nickel layer is arranged between the conductor layer 2 and the reflective layer 3, the reflective layer 3 easily becomes glossy, so that a reflectance can be increased. The average thickness of the nickel layer is 1 μm or more and 10 μm or less, for example. The average thickness of a palladium layer is 0.05 μm or more and 0.5 μm or less, for example. The average thickness of the reflective layer 3 is 0.1 μm or more and 10 μm or less, for example. The reflective layer 3 with an average thickness of 0.2 μm or more has a particularly high reflectance.

Subsequently, the resist pattern is removed, and protruding portions of the thin layers of titanium and copper are removed by etching.

Subsequently, a paste forming the resin layer 4 (hereinafter, "paste for resin layer") is prepared. The paste for resin layer is a paste in which a silicone resin material and white inorganic filler powder are dispersed in an organic solvent, for example.

As the silicone resin material, organo polysiloxane, organohydrogen polysiloxane, platinum-containing polysiloxane, and the like can be used. As the white inorganic filler, titanium oxide, aluminum oxide, zirconium oxide, barium oxide, barium sulfate, zinc oxide, barium titanate, potassium titanate, and the like can be used. As the organic solvent, one selected from carbitol, carbitol acetate, terpineol, metacresol, dimethylimidazole, dimethyl imidazolidinone, dimethylformamide, diacetone alcohol, triethylene glycol, paraxylene, ethyl lactate, and isophorone or two or more that are selected from those materials and are mixed with each other can be used.

Regarding a mass ratio in the paste for resin layer, materials are mixed in such a manner that a mass ratio of the white inorganic filler is 0.5 to 4 and a mass ratio of the organic solvent is 20 to 100 with respect to the silicone resin material whose mass ratio is assumed as 1, for example. The paste for resin layer is then printed to be in contact with the conductor layer 2 and the reflective layer 3 on the substrate 1. The thickness of the paste for resin layer is set to be approximately equal to a total thickness of the conductor layer 2 and the reflective layer 3.

Subsequently, the substrate 1 is subjected to heat treatment by being held at a maximum temperature of 140° C. or more and 200° C. or less for 0.5 hours or more and 3 hours or less.

Subsequently, buffing is performed for surfaces of the reflective layer 3 and the resin layer 4. As a buffing condition, it suffices that abrasive grain of silicon carbide, white alumina, or diamond having a grit size of 400 or more and 3000 or less is used, and a feed rate is set to 500 mm/s or more and 2000 mm/s or less. Further, chemical polishing may be additionally performed after buffing. As a condition of chemical polishing, it suffices that hydrogen peroxide solution with sulfuric acid added thereto is heated to a temperature of 50° C. or more and 65° C. or less, and the substrate 1 is immersed in this solution for 15 minutes or more and 45 minutes or less. By changing the buffing condition and the condition of chemical polishing within the above-described condition ranges, it is possible to provide any surface texture to the surface of the reflective layer 3, so that the circuit board 10 of the present disclosure is obtained.

Subsequently, the light-emitting device 20 of the present disclosure can be obtained by mounting the light-emitting element 5 on the reflective layer 3 of the circuit board 10 of the present disclosure, for example.

Examples of the present disclosure are specifically described below. However, the present disclosure is not limited to the examples.

Example 1

Samples were manufactured which were different in arithmetic mean roughness Ra, skewness Rsk, and kurtosis Rku in a surface of a reflective layer, and were subjected to reflectance measurement.

First of all, a 0.38 mm thick substrate of aluminum nitride ceramic was prepared.

Thin layers of titanium and copper were then formed on the substrate by sputtering. The titanium layer and the copper layer were formed to have average thicknesses of 0.1 µm and 1.0 µm, respectively.

Subsequently, a resist pattern was formed on a thin film by photolithography, and a copper layer with an average thickness of 60 µm was formed by electrolytic copper plating. In this manner, a conductor layer was obtained.

Subsequently, electrolytic nickel-silver plating was performed to obtain a reflective layer of silver on the conductor layer. A nickel layer between the conductor layer and the reflective layer was formed to have an average thickness of 5 µm, and the reflective layer was formed to have an average thickness of 3 µm.

Subsequently, the resist pattern was removed, and a protruding portion of the thin films of titanium and copper was removed by etching. In this manner, a stack of the conductor layer and the reflective layer having an area of 101 mm×101 mm was obtained.

Subsequently, a paste was prepared as a paste for resin layer, in which polysiloxane as a silicone resin material and titanium oxide as white inorganic filler powder were dispersed in an organic solvent.

The paste for resin layer was then printed to be in contact with the conductor layer and the reflective layer on the substrate. Thereafter, the substrate was subjected to heat treatment by being held at a maximum temperature of 150° C. for one hour.

Buffing and chemical polishing were then performed to make a surface texture of a surface of the reflective layer have values in Table 1, so that samples were obtained.

Subsequently, in each of the obtained samples, the arithmetic mean roughness Ra, the skewness Rsk, and the kurtosis Rku in the surface of the reflective layer were measured by using a contact-type surface roughness measuring device in conformity to JIS B 0601(2013). As a measurement condition, a measurement length was set to 2.5 mm, a cut-off value was set to 0.08 mm, a stylus with a stylus radius of 2 µm was used, and a scan rate was set to 0.6 mm/s. The measurement was performed at three positions in the surface of the reflective layer and an average value was obtained.

Subsequently, measurement was performed for each sample by using a spectrophotometer (Minolta, CM-3700A) under a condition in which the standard illuminant D65 was used, a wavelength range was 360 to 740 nm, a field was 10°, and an illumination diameter was 3×5 mm, so that a reflectance at 500 nm was measured from the measurement result.

Results are represented in Table 1.

TABLE 1

| Sample No. | Ra (µm) | Rku | Rsk | Rku/Rsk | Reflectance (%) |
|---|---|---|---|---|---|
| 1 | 0.32 | 4.8 | 1.8 | 2.7 | 73.2 |
| 2 | 0.19 | 8.5 | 1.8 | 4.7 | 85.1 |
| 3 | 0.19 | 9.0 | 1.8 | 5.0 | 90.2 |
| 4 | 0.15 | 15.9 | 1.9 | 8.4 | 92.1 |
| 5 | 0.09 | 26.3 | 1.9 | 13.8 | 93.1 |
| 6 | 0.07 | 31.9 | 2.3 | 13.9 | 92.2 |
| 7 | 0.07 | 30.0 | 2.0 | 15.0 | 90.5 |
| 8 | 0.05 | 30.0 | 1.5 | 20.0 | 72.8 |

As represented in Table 1, the reflectance of each of Samples Nos. 3 to 7 was 90.2% or more, which was higher than that of each of Samples Nos. 1, 2, and 8. It is found from this result that a surface of a reflective layer has a high reflectance when the arithmetic mean roughness Ra is smaller than 0.2 µm and a ratio of the kurtosis Rku to the skewness Rsk is 5 or more and 15 or less.

Example 2

Next, samples were manufactured which were different in a material portion Mr1 of a roughness core in a projecting peak and a material portion Mr2 of a roughness core in a projecting valley in a surface of a reflective layer, and were subjected to reflectance measurement.

The method of manufacturing each sample was identical to the method of manufacturing Sample No. 4 in Example 1 except that buffing and chemical polishing were performed to make a surface texture of the surface of the reflective layer have values in Table 2. Sample No. 9 is the same as Sample No. 4 in Example 1.

The material portion Mr1 of the roughness core in the projecting peak and the material portion Mr2 of the roughness core in the projecting valley in the surface of the reflective layer were then measured for each of the obtained samples. The measurement condition was identical to that in Example 1 based on JIS B 0671-2(2002). A reflectance of each sample was also evaluated by the same method as that in Example 1.

Results are represented in Table 2.

TABLE 2

| Sample No. | Mr1 | Mr2 | Mr2/Mr1 | Reflectance (%) |
|---|---|---|---|---|
| 9 | 39.5 | 63.0 | 1.6 | 92.1 |
| 10 | 24.0 | 74.0 | 3.1 | 93.0 |
| 11 | 14.3 | 84.8 | 5.9 | 93.1 |
| 12 | 13.4 | 85.9 | 6.4 | 93.4 |
| 13 | 10.3 | 88.7 | 8.6 | 93.5 |

As represented in Table 2, the reflectance of each of Samples Nos. 10 to 13 was 93.0% or higher, which was higher than that of Sample No. 9. It is found from this result that a surface of a reflective layer has a higher reflectance when a ratio of the material portion Mr2 of a roughness core in a projecting valley to the material portion Mr1 of a roughness core in a projecting peak is larger than 3.

Example 3

Next, samples were manufactured which were different in a magnitude relation between a reduced valley depth Rvk and a reduced peak height Rpk in a surface of a reflective layer, and were subjected to reflectance measurement.

The method of manufacturing each sample was identical to the method of manufacturing Sample No. 4 in Example 1 except that buffing and chemical polishing were performed to make a surface texture of the surface of the reflective layer have values in Table 3. Sample No. 15 is the same as Sample No. 4 in Example 1.

With regard to each of the obtained samples, the reduced valley depth Rvk and the reduced peak height Rpk in the surface of the reflective layer were measured. The measurement condition was identical to that in Example 1 based on JIS B 0671-2(2002). A reflectance of each sample was also evaluated by the same method as that in Example 1.

Results are represented in Table 3.

TABLE 3

| Sample No. | Relation between Rvk and Rpk | Reflectance (%) |
|---|---|---|
| 14 | Rvk < Rpk | 93.7 |
| 15 | Rvk > Rpk | 92.1 |

As represented in Table 3, the reflectance of Sample No. 14 was 93.7%, which was higher than that of Sample No. 15. It is found from this result that a surface of a reflective layer has a higher reflectance when the reduced valley depth Rvk is smaller than the reduced peak height Rpk.

Example 4

Next, samples were manufactured which were different in a rate of plateau Hp(10-60%) and a rate of plateau Hp(10-20%) in a surface of a reflective layer, and were subjected to reflectance measurement.

The method of manufacturing each sample was identical to the method of manufacturing Sample No. 4 in Example 1 except that buffing and chemical polishing were performed to make a surface texture of the surface of the reflective layer have values in Table 4. Sample No. 16 is the same as Sample No. 4 in Example 1.

With regard to each of the obtained samples, the rate of plateau HP(10-60%) and the rate of plateau Hp(10-20%) in the surface of the reflective layer were measured. The measurement condition was identical to that in Example 1 based on JIS B 0671-2(2002). A reflectance of each sample was also evaluated by the same method as that in Example 1.

Results are represented in Table 4.

TABLE 4

| Sample No. | Hp(10-60%) (μm) | Hp(10-20%) (μm) | Hp(10-60%)/ Hp(10-20%) | Reflectance (%) |
|---|---|---|---|---|
| 16 | 0.36 | 0.07 | 5.14 | 92.1 |
| 17 | 0.32 | 0.07 | 4.57 | 92.5 |
| 18 | 0.30 | 0.09 | 3.33 | 93.5 |
| 19 | 0.25 | 0.09 | 2.78 | 93.7 |
| 20 | 0.18 | 0.09 | 2.00 | 93.9 |
| 21 | 0.18 | 1.00 | 0.18 | 93.9 |

As represented in Table 4, the reflectance of each of Samples Nos. 18 to 21 was 93.5% or higher, which was higher than that of each of Samples Nos. 16 and 17. It is found from this result that a surface of a reflective layer has a higher reflectance when the rate of plateau Hp (10-60%) is equal to or less than 0.30 μm and a ratio of the rate of plateau Hp(10-60%) to the rate of plateau Hp(10-20%) is less than 3.5.

Example 5

Next, samples were manufactured which were different in a component of a reflective layer, and were subjected to reflectance measurement and a migration test.

First of all, a 0.38 mm thick substrate of aluminum nitride ceramic was prepared.

Subsequently, thin layers of titanium and copper (hereinafter, simply "thin film") were formed on the substrate by sputtering. The titanium layer and the copper layer were formed to have average thicknesses of 0.1 μm and 1.0 μm, respectively.

Subsequently, a resist pattern was formed on the thin film by photolithography, and a copper layer with an average thickness of 60 μm was formed by electrolytic copper plating. In this manner, a conductor layer was obtained. The resist pattern was set in such a manner that the number of conductor layers was two after the resist pattern was removed. Specifically, the resist pattern was set in such a manner that the two conductor layers were arranged to face to such a direction that longer directions thereof were aligned with each other, and an interval between the conductor layers was 80 μm. Each of the two conductor layers was formed to be a rectangle having a size of 400 μm×250 μm as the size of the longer direction×the shorter direction.

Subsequently, regarding Sample No. 22, electrolytic nickel-silver plating was performed to obtain a silver reflective layer on the two conductor layers. A nickel layer between the conductor layer and the reflective layer was formed to have an average thickness of 5 μm, and the reflective layer was formed to have an average thickness of 3 μm.

Meanwhile, regarding Sample No. 23, electroless nickel plating was performed and thereafter electroless gold plating was performed, so that a gold reflective layer was obtained on the two conductor layers. A nickel layer between the conductor layer and the reflective layer was formed to have an average thickness of 5 μm, and the reflective layer was formed to have an average thickness of 3 μm.

Subsequently, the resist pattern was removed, and a protruding portion of the thin film of titanium and copper was removed by etching. In this manner, two rectangular stacks of the conductor layer and the reflective layer having a size of 400 μm×250 μm as the size of the longer direction× the shorter direction were obtained.

Subsequently, a paste was prepared as a paste for resin layer, in which polysiloxane as a silicone resin material and titanium oxide as white inorganic filler powder were dispersed in an organic solvent.

Subsequently, the paste for resin layer was printed on the substrate in the form of a square having a size of 800 μm×800 μm as the size of the longer direction×the shorter direction, to embed a gap between the two stacks and cover the stacks. Thereafter, the substrate was subjected to heat treatment by being held at a maximum temperature of 150° C. for one hour.

Buffing and chemical polishing were then performed to make a surface texture of a surface of the reflective layer the same as that in Sample No. 20 in Example 4, so that Samples Nos. 22 and 23 were obtained.

Subsequently, components of the reflective layer of each sample were confirmed by the following method. First of all, each sample was cut, and a cut cross-section was polished with a CP. Subsequently, the polished cross-section was observed as an observation surface by using a SEM and the components of the reflective layer were confirmed by using an EDS attached to the SEM. As a result, the reflective layer in Sample No. 22 contained 95 mass % or more of silver in 100 mass % of all components of the reflective layer. Meanwhile, the reflective layer in Sample No. 23 contained 95 mass % or more of gold in 100 mass % of all components of the reflective layer.

Subsequently, a reflectance of each sample was evaluated by the same method as that in Example 1.

Also, a migration test was performed for each sample. First of all, two reflective layers in each sample were connected to each other by a conducting wire. Subsequently, each sample was placed in an environment of a high temperature (85° C.) and a high humidity (85%), and was left in a state where a current was caused to flow in the reflective layers in the sample. Each sample was then taken out from the above environment every 50 hours after a current started to flow, the conducting wire connecting the two reflective layers was detached, and it was checked if the two reflective layers were electrically conducting. Evaluation was then performed in such a manner that an evaluation result was represented by a cross when it was confirmed that the two reflective layers were electrically conducting before 250 hours passed after a current started to flow, an evaluation result was represented by a triangle when it was confirmed that the two reflective layers were electrically conducting before 1000 hours passed after a current started to flow, and an evaluation result was represented by a circle when it was not confirmed that the two reflective layers were electrically conducting before 1000 hours passed after a current started to flow.

Results are represented in Table 5.

TABLE 5

| Sample No. | Component of reflective layer | Reflectance (%) | Evaluation result |
| --- | --- | --- | --- |
| 22 | Ag | 93.9 | Δ |
| 23 | Au | 93.1 | ○ |

As represented in Table 5, the result of the migration test for Sample No. 23 is represented as a circle. It is found from this result that when a reflective layer contains 95 mass % or more of gold in 100 mass % of all components of the reflective layer, it has excellent long-term reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A circuit board comprising:
   a substrate;
   a conductor layer located on the substrate;
   a reflective layer located on the conductor layer; and
   a resin layer located on the substrate to be in contact with the conductor layer and the reflective layer, wherein
   in a surface of the reflective layer, arithmetic mean roughness Ra obtained from the roughness profile is less than 0.2 μm and a ratio of kurtosis Rku obtained from the roughness profile to skewness Rsk obtained from a roughness profile is 5 or more and 15 or less.

2. The circuit board according to claim 1, wherein in the surface of the reflective layer, a ratio of a material portion Mr2 of a roughness core in a projecting valley obtained from a roughness profile to a material portion Mr1 of the roughness core in a projecting peak obtained from the roughness profile is larger than 3.

3. The circuit board according to claim 2, wherein in the surface of the reflective layer, a reduced valley depth Rvk obtained from the roughness profile is smaller than a reduced peak height Rpk obtained from the roughness profile.

4. The circuit board according to claim 2, wherein in the surface of the reflective layer, a rate of plateau whose relative material length obtained from the roughness profile is 10 to 60%, Hp(10-60%), is 0.30 μm or less, and a ratio of the rate of plateau Hp(10-60%) to a rate of plateau whose relative material length obtained from the roughness profile is 10 to 20%, Hp(10-20%), is less than 3.5.

5. The circuit board according to claim 2, wherein the reflective layer contains 95 mass % or more of gold in 100 mass % of all components of the reflective layer.

6. A light-emitting device comprising the circuit board according to claim 2 and a light-emitting element located on the circuit board.

7. The circuit board according to claim 1, wherein in the surface of the reflective layer, a reduced valley depth Rvk obtained from the roughness profile is smaller than a reduced peak height Rpk obtained from the roughness profile.

8. The circuit board according to claim 7, wherein in the surface of the reflective layer, a rate of plateau whose relative material length obtained from the roughness profile is 10 to 60%, Hp(10-60%), is 0.30 μm or less, and a ratio of the rate of plateau Hp(10-60%) to a rate of plateau whose relative material length obtained from the roughness profile is 10 to 20%, Hp(10-20%), is less than 3.5.

9. The circuit board according to claim 7, wherein the reflective layer contains 95 mass % or more of gold in 100 mass % of all components of the reflective layer.

10. A light-emitting device comprising the circuit board according to claim 2 and a light-emitting element located on the circuit board.

11. The circuit board according to claim 1, wherein in the surface of the reflective layer, a rate of plateau whose relative material length obtained from the roughness profile is 10 to 60%, Hp(10-60%), is 0.30 μm or less, and a ratio of the rate of plateau Hp(10-60%) to a rate of plateau whose relative material length obtained from the roughness profile is 10 to 20%, Hp(10-20%), is less than 3.5.

12. The circuit board according to claim 11, wherein reflective layer contains 95 mass % or more of gold in 100 mass % of all components of the reflective layer.

13. A light-emitting device comprising the circuit board according to claim 11 and a light-emitting element located on the circuit board.

14. The circuit board according to claim 1, wherein the reflective layer contains 95 mass % or more of gold in 100 mass % of all components of the reflective layer.

15. A light-emitting device comprising the circuit board according to claim 14 and a light-emitting element located on the circuit board.

16. A light-emitting device comprising the circuit board according to claim 1 and a light-emitting element located on the circuit board.

* * * * *